United States Patent
Bogner et al.

(10) Patent No.: US 8,042,964 B2
(45) Date of Patent: Oct. 25, 2011

(54) ILLUMINATION DEVICE HAVING LUMINOUS SPOTS FORMED BY LIGHT EMITTING DIODES

(75) Inventors: Georg Bogner, Hainsacker (DE); Patrick Kromotis, Penang (MY); Ralf Mayer, Bolanden (DE); Heinrich Noll, Groβ-Umstadt (DE)

(73) Assignees: Siemens Aktiengesellschaft, München (DE); OSRAM Opto Semiconductors GmbH, Regensburg (DE)

( * ) Notice: Subject to any disclaimer, the term of this patent is extended or adjusted under 35 U.S.C. 154(b) by 1046 days.

(21) Appl. No.: 10/529,675

(22) PCT Filed: Sep. 1, 2003

(86) PCT No.: PCT/DE03/02886
§ 371 (c)(1),
(2), (4) Date: Apr. 28, 2005

(87) PCT Pub. No.: WO2004/031844
PCT Pub. Date: Apr. 15, 2004

(65) Prior Publication Data
US 2006/0232969 A1    Oct. 19, 2006

(30) Foreign Application Priority Data
Sep. 30, 2002    (DE) ................... 102 45 892

(51) Int. Cl.
G09F 13/04    (2006.01)
(52) U.S. Cl. ...... 362/97.3; 362/97.2; 362/294; 362/373; 362/231; 257/89; 257/98; 349/61; 349/68
(58) Field of Classification Search .......... 362/97, 362/294, 373, 231; 257/89, 98; 349/61, 349/68
See application file for complete search history.

(56) References Cited

U.S. PATENT DOCUMENTS

| | | | |
|---|---|---|---|
| 5,119,174 A * | 6/1992 | Chen | 257/98 |
| 5,857,767 A * | 1/1999 | Hochstein | 362/373 |
| 6,375,340 B1 * | 4/2002 | Biebl et al. | 362/294 |
| 6,439,731 B1 | 8/2002 | Johnson et al. | |
| 6,799,865 B2 * | 10/2004 | Ellens et al. | 362/231 |
| 7,034,778 B1 | 4/2006 | Hähl | |
| 2002/0006040 A1 * | 1/2002 | Kamada et al. | 362/237 |
| 2002/0020845 A1 * | 2/2002 | Ogura et al. | 257/89 |
| 2002/0050958 A1 * | 5/2002 | Matthies et al. | 345/55 |
| 2002/0070914 A1 | 6/2002 | Bruning et al. | |
| 2002/0101362 A1 | 8/2002 | Nishimura | |

(Continued)

FOREIGN PATENT DOCUMENTS
DE    200 05 862 U1    9/2000
(Continued)

OTHER PUBLICATIONS

Japanese Office Action issued in the corresponding foreign application, Nov. 2, 2007.
(Continued)

Primary Examiner — Ismael Negron
(74) Attorney, Agent, or Firm — Cozen O'Connor

(57) ABSTRACT

An illumination device for backlighting an image reproduction device containing light valves, the illumination device including a plurality of luminous spots arranged in grid format on a flat thermally conductive carrier. Each luminous spot having a plurality of light emitting diodes electrically insulated from one another, and a submount exhibiting good thermal conductivity and being connected to the carrier.

3 Claims, 3 Drawing Sheets

U.S. PATENT DOCUMENTS

| | | | |
|---|---|---|---|
| 2003/0052594 A1* | 3/2003 | Matsui et al. | 362/231 |
| 2003/0189829 A1* | 10/2003 | Shimizu et al. | 362/294 |
| 2004/0062040 A1* | 4/2004 | Blume et al. | 362/293 |
| 2005/0258446 A1* | 11/2005 | Raos et al. | 257/98 |

FOREIGN PATENT DOCUMENTS

| | | |
|---|---|---|
| DE | 200 07 730 U1 | 9/2000 |
| DE | 199 21 684 A1 | 11/2000 |
| DE | 100 08 203 A1 | 8/2001 |
| EP | 0 864 432 A2 | 9/1998 |
| EP | 0 921 568 A2 | 6/1999 |
| GB | 2 361 581 | 10/2001 |
| GB | 2 361 581 A | 10/2001 |
| GB | 2 370 103 A | 6/2002 |
| JP | 61-158606 | 7/1986 |
| JP | 7262810 | 10/1995 |
| JP | 2000-031547 | 1/2000 |
| JP | 2000133029 | 5/2000 |
| JP | 3072840 | 8/2000 |
| JP | 2001-237462 | 8/2001 |
| JP | 2001308384 | 11/2001 |
| JP | 2001356294 | 12/2001 |
| JP | 2002009349 | 1/2002 |
| JP | 2002503832 T | 2/2002 |
| JP | 2002533870 T | 10/2002 |
| WO | WO 99/41732 | 8/1999 |
| WO | WO 99/41788 | 8/1999 |
| WO | WO 00/37904 | 6/2000 |

OTHER PUBLICATIONS

Examination Report dated Apr. 24, 2008 (with English translation) issued for the corresponding Japanese Patent Application 2004-540476.

* cited by examiner

ILLUMINATION DEVICE HAVING LUMINOUS SPOTS FORMED BY LIGHT EMITTING DIODES

CROSS REFERENCE TO RELATED APPLICATIONS

This is a U.S. national stage of application No. PCT/DE2003/002886, filed on 1 Sep. 2003. Priority is claimed on the following application(s): Country: Germany, Application No. 102 45 892.8, Filed: 30 Sep. 2002, the content of which is/are incorporated here by reference.

BACKGROUND OF THE INVENTION

1. Field of the Invention

The invention relates to an illumination device for backlighting an image reproduction device containing light valves, wherein luminous spots formed by a plurality of light emitting diodes are in each case arranged in grid form.

2. Description of the Prior Art

Image reproduction devices having light valves, in particular liquid crystal displays, require sufficiently bright and uniform backlighting. This is achieved by means of fluorescent tubes in the case of relatively large displays, such as computer screens for example. The known illumination devices do not suffice, however, in applications requiring a very high luminance. Thus, a very high luminance is required for so-called head-up displays in motor vehicles, by way of example, since the reflected image of the display must still be visible even when there is high ambient brightness.

GB 2 361 581 shows an arrangement having a light emitting diode which is arranged in a depression of a heat-dissipating substrate. A plurality of such substrates may be arranged in grid form, a printed circuit connecting all light emitting diodes and substrates to one another. However, this arrangement is difficult to produce; in particular, connecting individual light emitting diodes in series is very difficult.

SUMMARY OF THE INVENTION

Therefore, it is an object of the invention to specify an illumination device which has a high luminance on a given area. This object is achieved according to the invention by virtue of the fact that the light emitting diodes of a respective luminous spot
are applied in an electrically insulated manner on the essentially planar surface of a submount, and that the submounts have good thermal conductivity and are connected to a flat thermally conductive carrier in a manner exhibiting good thermal conductivity.

The invention advantageously exploits the fact that a multiplicity of small light emitting diodes emit more light than a correspondingly large diode since the entire free surface area of the light emitting diode emits radiation. The invention additionally ensures good heat dissipation.

One advantageous development of the illumination device according to the invention consists in the fact that the area of the submounts is in each case less than the area provided by the grid, and that lines for supplying power to the light emitting diodes are arranged between the submounts on an insulating carrier on that area of the carrier which is not occupied by submounts. This enables an advantageous thermally conductive connection between the light emitting diodes and the carrier without the lines applied in an insulated manner impeding the heat conduction.

This development may advantageously be refined by the lines being routed in a flexible film that is continued as a flat lead outside the carrier. This means that no further contact-connection is necessary apart from the contact-connection of the lines to the light emitting diodes within the illumination device, which contributes to operational reliability and to inexpensive producibility.

Preferably the invention provides for the submounts to be composed of silicon. In order to further improve the heat dissipation, the invention may provide for
the carrier to be composed of ultrapure aluminum or copper and/or for the carrier to be connected to a heat sink. An example of a suitable heat sink is a large cooling element that emits heat to the surrounding air over a largest possible surface area. Furthermore, so-called heat pipes are suitable as a heat sink.

Furthermore, the illumination device according to the invention preferably provides for interspaces between the submounts to be filled with plastic.

For backlighting a monochrome display, the light emitting diodes may be identically colored. In order to obtain a color that is not available as a light emitting diode or for backlighting a color display, one development provides for the light emitting diodes of a respective luminous spot to emit varicolored light.

The use of a plurality of light emitting diodes for a respective luminous spot has the advantage of a higher luminous efficiency compared with a larger light emitting diode. It has proved to be expedient for four light emitting diodes to form a luminous spot. A different number of light emitting diodes per luminous spot is also possible, however, in the context of the invention.

Another advantageous refinement consists in the fact that two green-luminous light emitting diodes, one blue-luminous and one red-luminous light emitting diode are provided per luminous spot. Although this emphasizes the green component of the generated light compared with the other components, this is necessary in order to obtain white, for example approximately 60% green, 25% red and 15% blue.

Arranging the luminous spots on submounts has the advantage that the side walls of the light emitting diodes are elevated completely above the lines routed between the luminous spots, so that the radiation emerging therefrom can be utilized. In order to utilize the latter for backlighting the display, another development of the invention provides for the luminous spots to be surrounded by a respective reflector. It is preferably provided in this case that a depression that is formed by the reflector and contains the luminous spot is filled with a transparent plastic.

The light source according to the invention has a high efficiency, long service life, high reliability in respect of failure, defined emission and—when varicolored light emitting diodes are used—a narrowband emission in different colors. It is thus possible to match the spectral emission of the light source and spectral transmission of the color filters of the liquid crystal display and to keep down the light losses due to the color filters. The high efficiency of the light emitting diodes results in a high intensity in conjunction with little generation of heat.

The uniform distribution of the color spots over the entire visible area, in conjunction with a suitable focusing device, results in a further effective increase in the luminance. In this case, the uniform distribution of the luminous spots over the entire visible area results in a uniform luminance distribution which can be increased further by the focusing device. The compact arrangement of the light emitting diodes in a respective luminous spot results in good color mixing. The whitereflective area and the reflector form mean that light which is then emitted at a less favorable angle is utilized. The use of very small light emitting diodes results in a compact arrangement having a thickness of a few millimeters, for example 2 mm.

The light emitting diodes require a very low operating voltage, with the result that a plurality of light emitting diodes are expediently connected in series. In the event of one of said light emitting diodes failing, the others are no longer supplied with power and likewise fail. In order to reduce or even to preclude, if appropriate, a visibility of this effect, another development of the illumination device according to the invention provides for a respective light emitting diode of one luminous spot with a respective light emitting diode of a plurality of other luminous spots, connected in series, to form an electric circuit.

In order in this case to prevent particular disturbing stripes or dots from arising in the event of a light emitting diode failing, this development may be designed in such a way that the luminous spots whose light emitting diodes are associated with a respective electric circuit are interleaved with luminous spots of at least one other electric circuit. The interleaving makes it possible, with suitable optical light distribution means, to make the failure of a group hardly visible.

Another advantageous refinement of this development consists in the fact that when a plurality of identically colored light emitting diodes are present per luminous spot, the identically colored light emitting diodes are connected to different electric circuits. Without further measures, a brightness and color change occurs in this case which can be tolerated for many applications.

However, the color change can be compensated for by virtue of the fact that control devices are provided for the currents fed to the individual electric circuits, which control devices, in the event of interruption of one of the electric circuits for identically colored light emitting diodes, control the currents in the electric circuits for the at least one other electric circuit for identically colored light emitting diodes and for differently colored light emitting diodes of the same luminous spots in the sense of compensating for the color shift brought about by the interruption.

Insofar as it is possible with regard to the permissible power loss of the affected light emitting diodes, it may be provided in this case that the current in the at least one other electric circuit for identically colored light emitting diodes is increased. With this measure, both the brightness and the color can be brought to the original state.

If it is not possible or expedient to increase the power of the remaining identically colored light emitting diodes, then the currents in the electric circuits for differently colored light emitting diodes may be decreased. As a result, although the brightness is reduced, the color can essentially be maintained.

Another advantageous refinement of the development consists in the fact that a grid of 4×8 luminous spots having in each case two green-luminous and two red-luminous light emitting diodes is present, that four electric circuits are provided for the red-luminous light emitting diodes, two electric circuits in each case being assigned to the light emitting diodes of identical luminous spots which are distributed over the grid in checkered fashion. In this case, it is preferably provided that the green-luminous light emitting diodes are connected to eight electric circuits, in each case one green-luminous light emitting diode of eight luminous spots being connected to one electric circuit and a further green-luminous light emitting diode of the same luminous spots being connected to another electric circuit.

This refinement takes account of the fact that owing to the different voltages required for the red-luminous and the green-luminous light emitting diodes and owing to an expedient operating voltage having a magnitude of approximately 40 V, sixteen red-luminous but only eight green-luminous light emitting diodes are connected in series.

BRIEF DESCRIPTION OF THE DRAWINGS

The invention permits numerous embodiments. One of these is illustrated schematically in the drawing using a number of figures and is described below. In the figures.

DETAILED DESCRIPTION OF THE PREFERRED EMBODIMENTS

Figure 1:
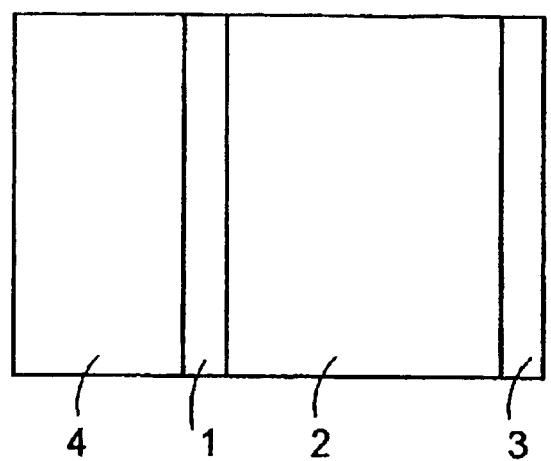
FIG. 1 is a schematic side view of a display backlit by means of the illumination device according to the invention.

FIG. 1 schematically illustrates an arrangement having a light source 1 and a display 3, an optical device 2 for focusing the light emerging from the light source 1 with the aim of uniform distribution over the area of the display 3 being provided between the light source 1 and the display 3. The distance between the light source and the display is a few centimeters. A heat sink 4 for heat dissipation is situated on the rear side of the light source 1.

Figure 2:
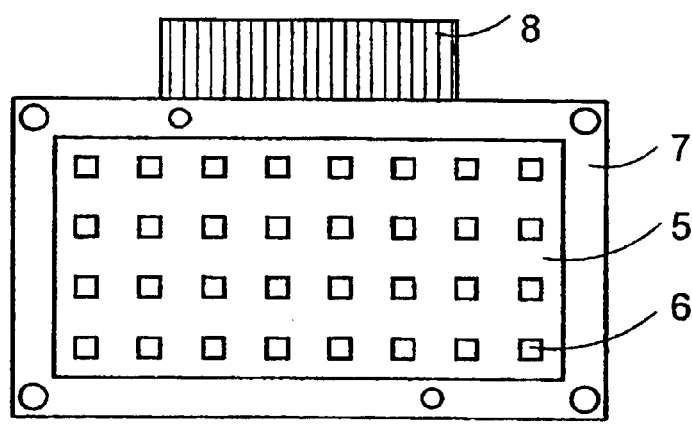
FIG. 2 is a plan view of the illumination device according to an embodiment.

FIG. 2 shows a plan view of the light source 1 having a white plastic frame containing 8×4 holes in the case of the exemplary embodiment illustrated, luminous spots 6 being situated in said holes. The size of the plastic frame 5 corresponds to the visible area of the display. The plastic frame 5 and the luminous spots 6 are situated on an aluminum plate 7 that serves for fixing and heat dissipation. Lines in the form of a ribbon cable 8 for connecting the light emitting diodes to a current source are led out laterally.

Figure 3:
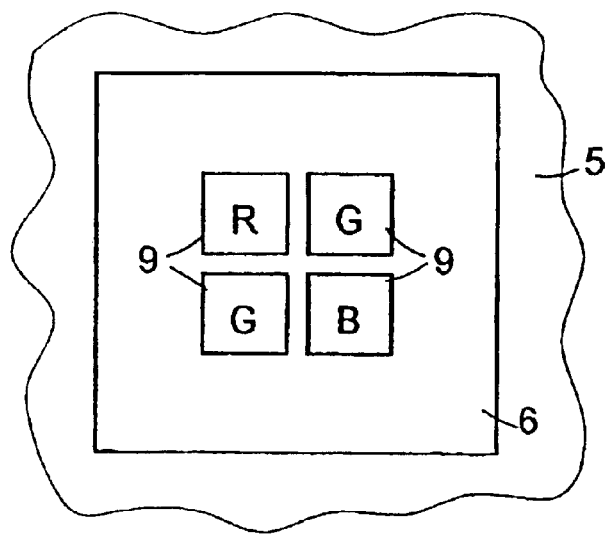
FIG. 3 is an enlarged view of one of the luminous spots of the device of FIG. 2.
Figure 4:
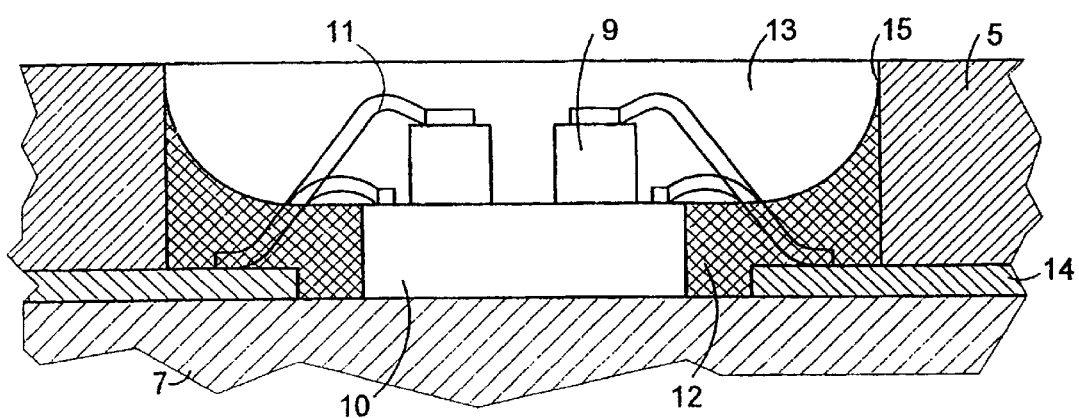
FIG. 4 is a sectional view of a luminous spot and of the parts of the exemplary embodiment which surround the luminous spot.

FIG. 3 shows an enlarged illustration of a luminous spot 6 formed by a hole in the plastic frame 5. Four light emitting diodes 9 are arranged in elevated fashion in the center of the hole on a submount 10 (FIG. 4). The light emitting diodes are connected via bonding wires 11 to lines 14, which are only illustrated schematically by hatching of the area that they occupy. In a preferred embodiment, one of the light emitting diodes emits red light, two emit green light and the fourth emits blue light. The light is mixed to form white in the case of this arrangement. The space between the submount 10 and the frame 5 is filled with a white potting composition 12, the surface 15 of which serves as a reflector for the light emitted laterally from the light emitting diodes 9. A transparent potting composition 13 provides for a smooth surface of the light source and protection of the bonding wires and light emitting diodes.

Figure 5:
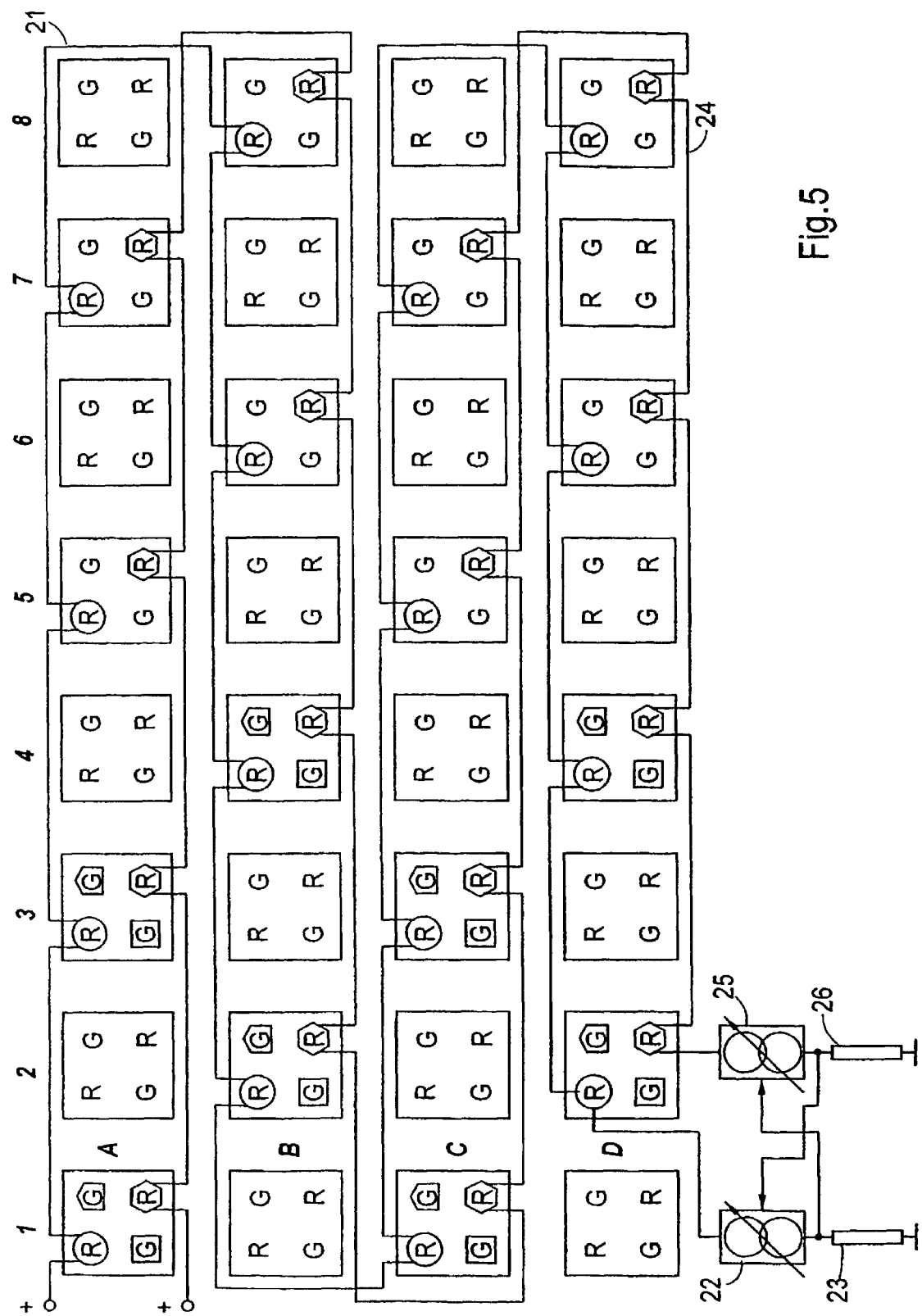
FIG. 5 is a schematic diagram of the power supply of the light emitting diodes.

FIG. 5 schematically illustrates the connection of the light emitting diodes of an exemplary embodiment with 32 luminous spots to electric circuits.

Since the multiplicity of connections can only be illustrated inadequately and confusingly in a drawing, the light emitting diodes whose power supply is illustrated or described specifically are identified by different symbols in accordance with their association with individual electric circuits. Two electric circuits for red-luminous light emitting diodes—also called red light emitting diodes hereinafter—are illustrated in detail. The columns of the grid are numbered 1 to 8, while the rows are identified by the letters A to D. To distinguish them from the reference symbols used elsewhere, the column numbers in FIG. 5 are printed in italics.

A respective one of the red light emitting diodes R of the luminous spots A1, A3, A5, A7, B2, B4 to D8 is connected to an electric circuit 21, which furthermore contains a controllable current source 22 and a current measuring resistor 23. In the same way, the respective other red light emitting diodes of the same luminous spots, namely A1, A3 to D8 are connected to a further electric circuit 24 having a controllable current source 25 and a current measuring resistor 26. The green light emitting diodes of the luminous spots A1, A3, B2, B4, C1, C3, D2 and D4 are correspondingly connected to two further electric circuits (not illustrated). Two further electric circuits (not illustrated) supply the green light emitting diodes of the luminous spots A5, A7, B6, B8, C5, C7, D6 and D8. The power supply of the luminous spots A2, A4, A6, A8 to D7 is effected correspondingly.

In the normal operating state, all the light emitting diodes are thus supplied with currents which are predetermined in such a way that the resulting light has the desired color. If one of the red light emitting diodes connected to the electric circuit 21 then fails, by way of example, this is ascertained with the aid of the absent voltage drop at the current measuring resistor 23 and the current source 25 is controlled with the aim of increasing the current in the electric circuit 24. If this is not possible for reasons of the loading capacity of the affected light emitting diodes or the thermal
balance of the individual luminous spots, then it is possible to perform a reduction of the currents in the green light emitting diodes—which is not illustrated in FIG. 5.

The interleaving of the luminous spots means that structures which arise in the event of a change in the color and/or brightness of luminous spots connected to identical electric circuits become less visible and can be distributed better by optical means than for example in the case of a row- or column-type assignment of the luminous spots to the respective electric circuits.

What is claimed is:
1. An illumination device for backlighting an image reproduction device containing light valves, the illumination device comprising:
a thermally conductive carrier having a flat mounting surface and a plurality of luminous spots arranged in a grid format on the flat mounting surface of said carrier, each of said luminous spots having a plurality of identically colored light emitting diodes and a submount, each of said plurality of identically colored light emitting diodes of a respective one of said luminous spots being electrically insulated from the others of the identically colored light emitting diodes of the respective one of said luminous spots, each of the identically colored light emitting diodes being connected to different electric circuits, said submounts exhibiting good thermal conductivity and connected to the flat mounting surface of said carrier such that the connections between said submounts and said carrier exhibit good thermal conductivity; and
control devices arranged and dimensioned for providing currents fed to each of the electric circuits, wherein said control devices, in the event of interruption of one of the electric circuits for said identically colored light emitting diodes which causes a color shift in the color produced by said luminous spot, control the currents in the electric circuits for the at least one other electric circuit for the identically colored light emitting diodes or for differently colored light emitting diodes of the same luminous spots to compensate for the color shift produced by the interruption;
wherein a respective one of said plurality of light emitting diodes of one luminous spot is connected in series with a respective light emitting diode of another one of said plurality of luminous spots and forms an electric circuit.
2. The illumination device of claim 1, wherein the control of the current comprises an increase in the current in the at least one other electric circuit for identically colored light emitting diodes.
3. The illumination device of claim 1, wherein the control of the current comprises a decrease in the current in the at least one other electric circuit for differently colored light emitting diodes.

* * * * *